United States Patent [19]

Mathews et al.

[11] Patent Number: 5,674,776
[45] Date of Patent: Oct. 7, 1997

[54] SEMICONDUCTOR PROCESSING METHODS OF FORMING FIELD OXIDATION REGIONS ON A SEMICONDUCTOR SUBSTRATE

[75] Inventors: Viju Mathews; Pierre C. Fazan; Nanseng Jeng, all of Boise, Id.

[73] Assignee: Micron Technology, Inc., Boise, Id.

[21] Appl. No.: 544,785

[22] Filed: Oct. 18, 1995

Related U.S. Application Data

[63] Continuation-in-part of Ser. No. 427,084, Apr. 20, 1995.
[51] Int. Cl.$^6$ ................................................. H01L 21/76
[52] U.S. Cl. ............................ 437/69; 437/61; 437/239
[58] Field of Search ............................... 437/69, 61, 60, 437/62, 70, 72, 239, 913

[56] References Cited

U.S. PATENT DOCUMENTS

| | | | |
|---|---|---|---|
| 4,554,726 | 11/1985 | Hillenius et al. | 437/69 |
| 4,987,093 | 1/1991 | Teng et al. | 437/69 |
| 5,061,654 | 10/1991 | Shimizu et al. | 437/60 |
| 5,134,089 | 7/1992 | Barden et al. | 437/70 |
| 5,234,859 | 8/1993 | Mametani et al. | 437/69 |
| 5,358,894 | 10/1994 | Fazan et al. | 437/70 |
| 5,374,586 | 12/1994 | Huang et al. | 437/69 |
| 5,393,694 | 2/1995 | Mathews | 437/72 |
| 5,472,904 | 12/1995 | Figura et al. | 437/69 |
| 5,543,343 | 8/1996 | Bryant et al. | 437/69 |

OTHER PUBLICATIONS

Chatterjee et al. "A Shallow Trench Isolation Study for 0.25/0.18 Micron CMOS Technologies and Beyond"; 1996 Symposium on VLSI Tech. Dig. of Technical Papers, p. 156.

Bryant, Andres et al., "Characteristics of CMOS Device Isolation for the ULSI Age", IEEE, 1994, pp. 671–674.

*Primary Examiner*—Michael Trinh
*Attorney, Agent, or Firm*—Wells, St. John, Roberts, Gregory & Matkin P.S.

[57] ABSTRACT

A semiconductor processing method of forming a pair of adjacent field oxide regions includes, i) providing a sacrificial pad oxide layer to a thickness of from 20 Angstroms to 100 Angstroms; ii) providing a patterned masking layer over the sacrificial pad oxide layer and over a desired active area region, the layer having a thickness of from 500 Angstroms to 3000 Angstroms and comprising a pair of adjacent masking blocks having a minimum pitch of from 0.5 micron to 0.7 micron; iii) oxidizing portions of the substrate unmasked by the masking layer in an $H_2O$ steam ambient at a pressure of from about 0.5 atmosphere to about 2 atmospheres and at a temperature of from about 900° C. to about 1200° C. to form at least one pair of adjacent field oxide regions, the formed field oxide regions having a location of maximum thickness of from 1500 Angstroms to 3000 Angstroms; iv) stripping the masking layer from the substrate; v) providing a gate oxide layer over the active area between the pair of field oxide regions; and vi) etching portions of the field oxide regions prior to providing the gate oxide, such etching resulting in removal of a total of from 250 to 1000 Angstroms of oxide from the field oxide regions prior to provision of the gate oxide, such etching resulting in a maximum width of the respective field oxide regions of from 0.20 to 0.40 micron and a minimum pitch of the adjacent pair of field oxide regions of from 0.5 to 0.7 micron.

20 Claims, 4 Drawing Sheets

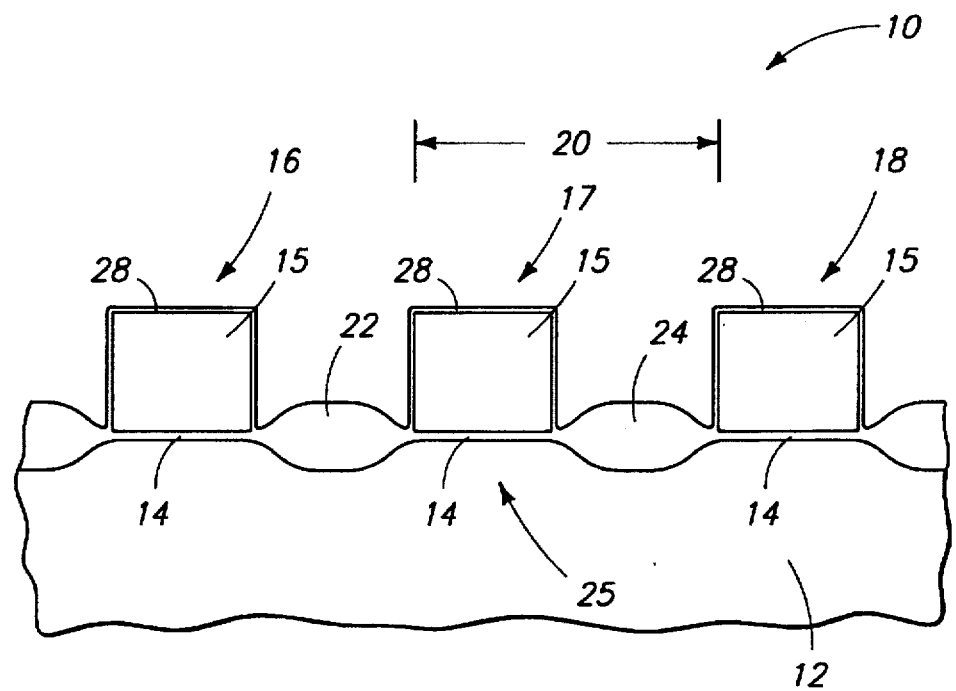
F I G 3
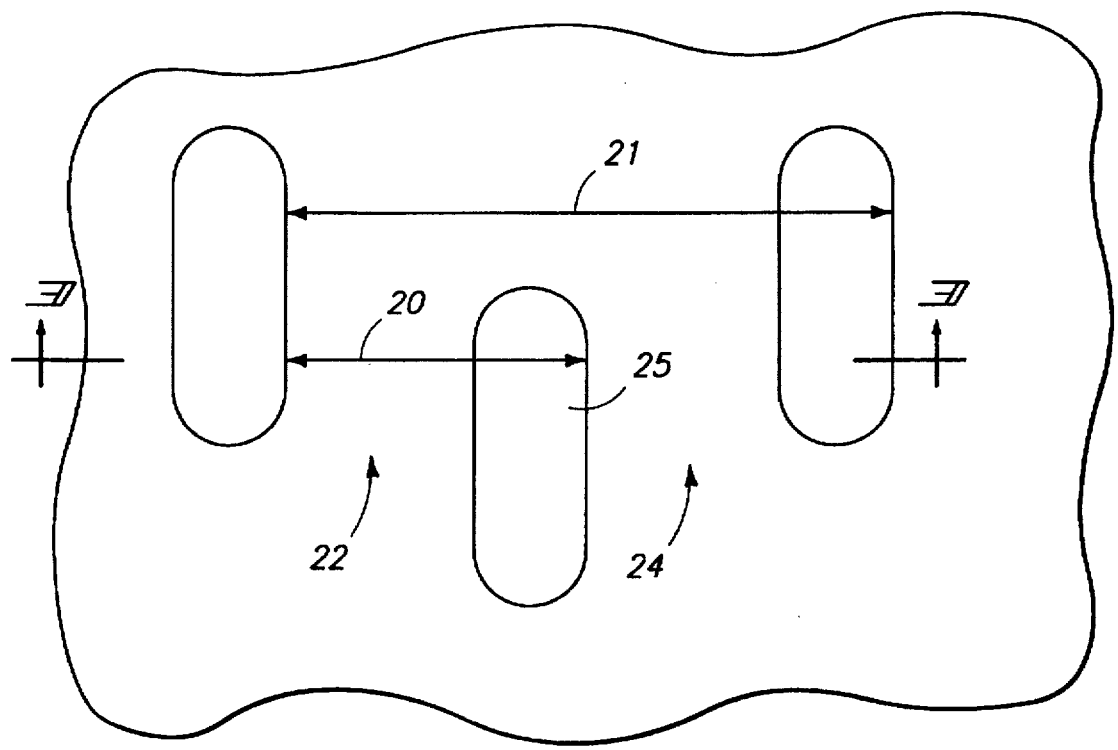
F I G 4

SEMICONDUCTOR PROCESSING METHODS OF FORMING FIELD OXIDATION REGIONS ON A SEMICONDUCTOR SUBSTRATE

RELATED PATENT DATA

This patent resulted from a continuation-in-part application of U.S. patent application Ser. No. 08/427,084, filed Apr. 20, 1995, entitled "Semiconductor Processing Methods Of Forming Field Oxidation Regions On A Semiconductor Substrate", listing the inventors as Viju Mathews, Pierre Fazan and Nanseng Jeng, and which is now abandoned.

TECHNICAL FIELD

This invention relates to semiconductor processing methods of forming field oxide regions on semiconductor substrates.

BACKGROUND PRIOR ART TO THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach in forming such oxide is to cover the active regions with a thin layer of silicon nitride that prevents oxidation from occurring there beneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet $H_2O$ oxidation, typically at atmospheric pressure and at temperatures of around 1000° C., for two to four hours. This results in field oxide growth where there is no masking nitride.

However at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension or encroachment of the field oxide into the active areas where the devices are formed. Although the length of the bird's beak depends upon a number of parameters, the length is typically 0.15 micron–0.5 micron per side.

This thinner area of oxide resulting from the bird's beak provides the disadvantage of not providing effective isolation in these regions, and as well unnecessarily consumes precious real estate on the semiconductor wafer. Further, as the circuit density (commonly referred to as minimum device pitch) falls below 1.0 micron, the general state of the prior art teaches that conventional LOCOS techniques fail due to excessive encroachment of the oxide beneath the masking stack. The closeness of the masking block stacks in such instances results in effective joining of adjacent bird's beaks, thus effectively lifting the stacks and resulting in no masking effect to the oxidation.

Because of the general prior art understanding that conventional LOCOS techniques are not practically usable where device pitch falls below 1.0 micron, sophisticated or advanced LOCOS techniques have been developed. Such example techniques include poly-buffered LOCOS, poly-buffered recessed LOCOS and poly-encapsulated LOCOS. These and other techniques add complexity and cost over conventional LOCOS techniques.

It would be desirable to develop processes which enable use of more conventional LOCOS techniques (i.e., wet oxidation at atmospheric or near atmospheric conditions) that can achieve minimization of bird's beak encroachment to be utilizable in 0.5 micron to 0.7 micron pitch technology.

BRIEF DESCRIPTION OF THE DRAWINGS

Preferred embodiments of the invention are described below with reference to the following accompanying drawings.

FIG. 3 is a view of the FIG. 1 wafer fragment at a processing step subsequent to that shown by FIG. 2.

FIG. 4 is a diagrammatic top view of FIG. 3 showing the field oxide regions.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a pair of adjacent field oxide regions having a minimum pitch of from 0.5 micron to 0.7 micron on a semiconductor substrate comprises the following steps:

provididing a sacrificial pad oxide layer over a semiconductor substrate to a thickness of from 20 Angstroms to 100 Angstroms;

providing a patterned masking layer over the sacrificial pad oxide layer and over a desired active area region of the substrate, the masking layer comprising a nitride and having a thickness of from 500 Angstroms to 3000 Angstroms, the patterned masking layer comprising a pair of adjacent masking blocks having a minimum pitch of from 0.5 micron to 0.7 micron;

oxidizing portions of the substrate unmasked by the masking layer in an $H_2O$ steam ambient at a pressure of from about 0.5 atmosphere to about 2 atmospheres and at a temperature of from about 900° C. to about 1200° C. to form at least one pair of adjacent field oxide regions on the substrate, the formed field oxide regions having a location of maximum thickness of from 1500 Angstroms to 3000 Angstroms, the pair of field oxide regions defining active area therebetween;

stripping the patterned masking layer from the substrate;

providing a gate oxide layer on the substrate over the active area between the pair of field oxide regions; and etching portions of the pair of field oxide regions prior to providing the gate oxide layer, such etching resulting in removal of a total of from 250 Angstroms to 1000 Angstroms of oxide from the field oxide regions prior to provision of the gate oxide layer, such etching resulting in a maximum width of the respective field oxide regions of from 0.20 micron to 0.40 micron and a minimum pitch of the adjacent pair of field oxide regions of from 0.5 micron to 0.7 micron.

Figure 1:
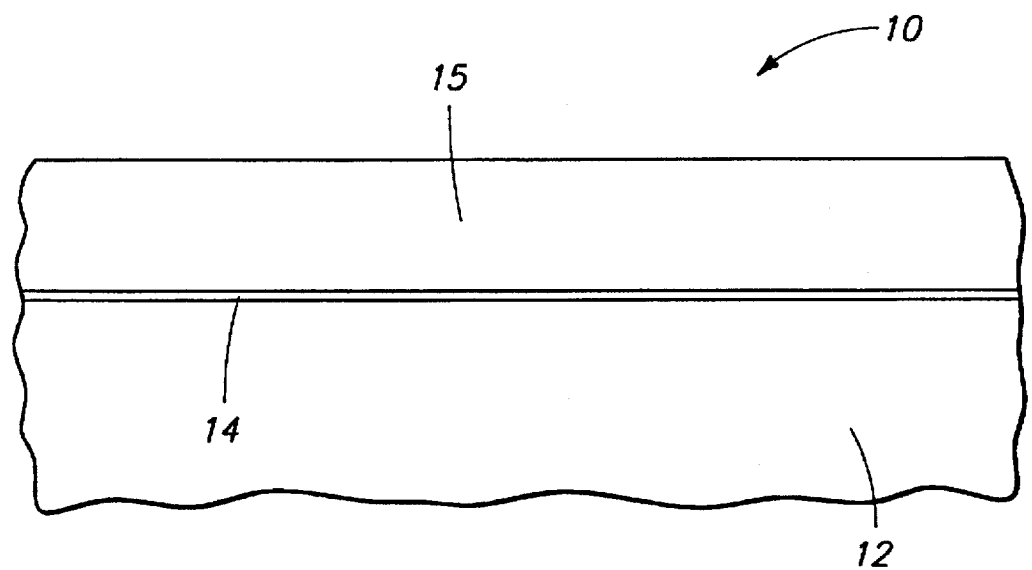
FIG. 1 is a diagrammatic sectional view of a semiconductor wafer fragment at one processing step in accordance with the invention.

More particularly with reference to the figures, FIG. 1 illustrates a semiconductor wafer fragment in process for formation of a pair of adjacent field oxide regions having a minimum pitch of from 0.5 micron to 0.7 micron, and is indicated generally with reference numeral 10. Such is comprised of a starting bulk semiconductor silicon substrate 12. A sacrificial pad oxide layer 14 is thermally grown over semiconductor substrate 12 to a thickness of from 20 Angstroms to 100 Angstroms. A masking layer 15, preferably $Si_3N_4$, is provided over sacrificial pad oxide layer 14 to a thickness of from 500 Angstroms to 3000 Angstroms. The function of layer 14 is to cushion the transition of stresses between silicon substrate 12 and nitride layer 15. Nitride layer 15 will function as the masking layer for ultimate formation of the field oxide regions in accordance with aspects of the invention.

Figure 2:
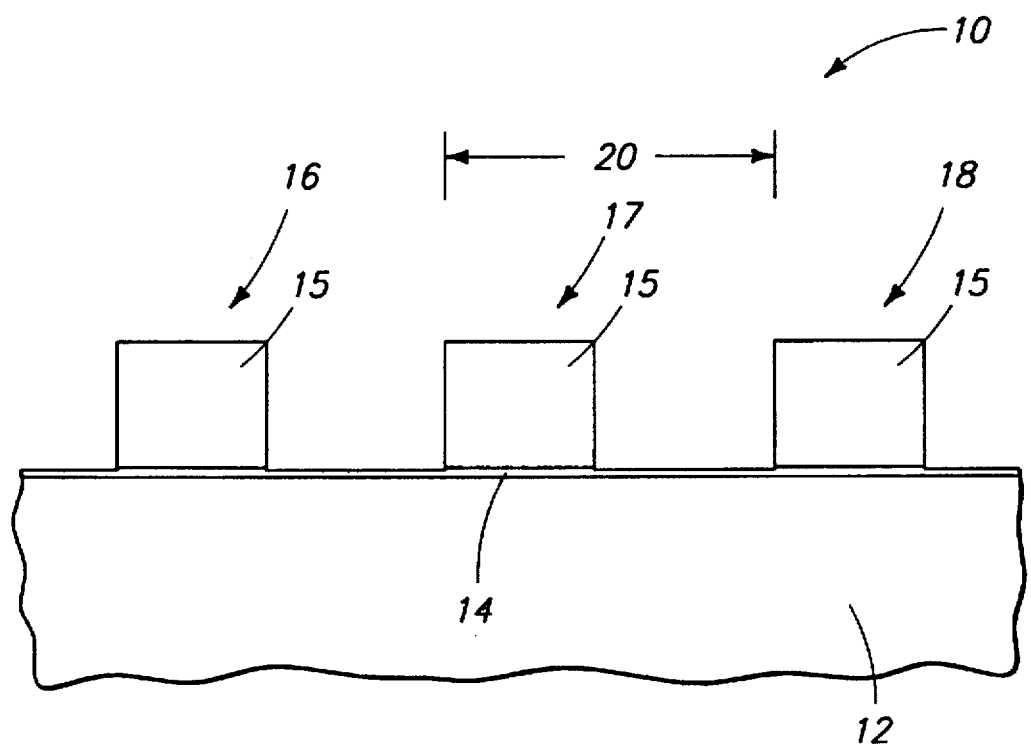
FIG. 2 is a view of the FIG. 1 wafer fragment at a processing step subsequent to that shown by FIG. 1.

Referring to FIG. 2, nitride layer 15 has been patterned and etched as shown to form nitride masking blocks 16, 17 and 18. A channel-stop implant can be conducted prior to removing the illustrated masking blocks, but is not particularly germane to this invention. The etch to produce nitride blocks 16, 17 and 18 is substantially selective to oxide layer 14. However, the etch does result in removal of a portion of pad oxide layer 14 in an uneven manner due to the inherent preferred thinness of layer 14. Blocks 16, 17 and 18 are provided to define and thereby overlie desired active area regions on the substrate. The illustrated masking blocks provide a minimum pitch 20 of adjacent blocks of from 0.5 micron to 0.7 micron, with 0.6 micron being typical and preferred.

Referring to FIG. 3, the wafer is subjected to oxidizing conditions to oxidize portions of the substrate which are unmasked by masking material 15 to form the illustrated pair of adjacent field oxide regions 22 and 24 relative to substrate 12. The oxidation is conducted in an $H_2O$ steam ambient at a pressure of from about 0.5 atmosphere to about 2 atmospheres and at a temperature of from about 900° C. to about 1200° C. The parent disclosure was initially predicated upon a belief that conventional steam oxidation was not capable of achieving 0.5 to 0.7 micron pitch due to excessive bird's beak encroachment. The parent disclosure overcomes the original perception by utilizing a high pressure $O_2$ atmosphere which is essentially void of $H_2O$ in combination with a discovered combination of narrow ranges of layer thicknesses. It has since been discovered that a steam atmosphere under a narrow range of pressure and temperature in combination with a set of narrow ranges of layer thicknesses enables 0.5 to 0.7 micron pitch to be achieved.

The oxidation is conducted to provide field oxide regions 22 and 24 to have a location of maximum thickness of from 1500 Angstroms to 3000 Angstroms. As depicted, field oxide regions 22 and 24 define substrate active area 25 therebetween. During field oxidation, a very thin layer 28 of oxide (20–200 Angstroms) results from transformation of the $Si_3N_4$ to $SiO_2$.

The invention was reduced to practice at a temperature of 1082° C. and 1 atmospheres. $H_2$ and $O_2$ were fed to the reactor at 5 slpm each to provide a steam atmosphere. Field oxide having a maximum thickness of 2200 Angstroms was grown in 18 minutes, 30 seconds. Pad oxide layer thickness was 60 Angstroms and masking layer thickness was 1900 Angstroms. The above described broad parameter ranges are expected to be usable in accordance with the invention. A narrow and more preferred set of ranges are sacrificial pad oxide thickness of from 50 Angstroms to 70 Angstroms; masking layer thickness of from 1700 Angstroms to 2100 Angstroms; pressure of from about 0.8 atmosphere to about 1.2 atmospheres; and temperature of from about 1000° C. to about 1150° C.

FIG. 4 illustrates a diagrammatic top view of FIG. 3 emphasizing the illustrated field oxide regions 22 and 24, and active area 25 therebetween. A staggered layout of the active area regions is preferably utilized, with pitch 20 being the minimum pitch between most closely adjacent field oxide regions. The staggering produces a wider pitch 21 (FIG. 4 only) between further spaced adjacent field oxide regions, as shown. During field oxidation, the location of maximum field oxide thickness typically occurs centrally relative to the respective widths of the regions along the wider pitch line 21. Field oxide thickness is typically less along pitch line 20, where substrate stress is greater due to closeness of the adjacent nitride masks.

Figure 5:
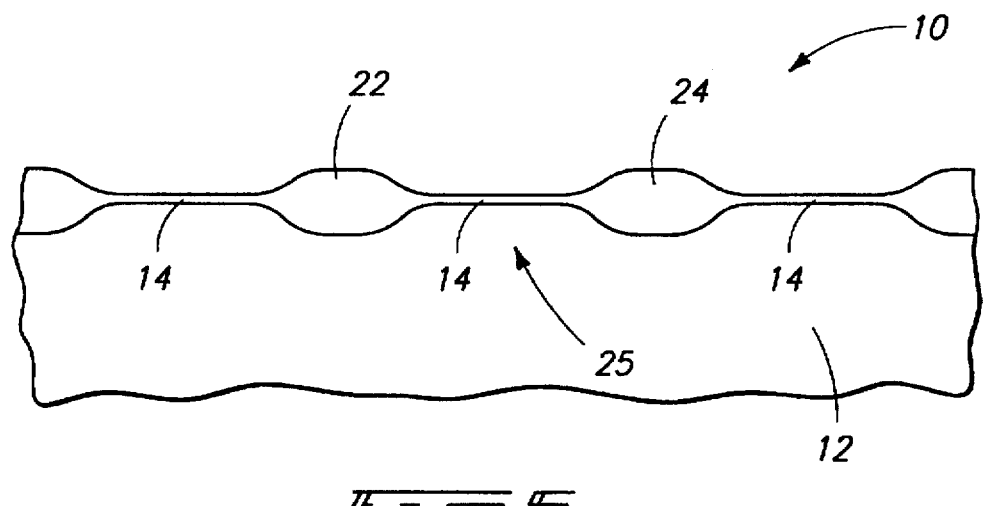
FIG. 5 is a view of the FIG. 1 wafer fragment at a processing step subsequent to that shown by FIG. 3.

Referring to FIG. 5, oxide layer 28 has been removed from the nitride layer 15 (not shown), resulting in removal of oxide from atop field oxide regions 24 in a quanta of from 50 Angstroms to 250 Angstroms. Patterned masking material 15 is then stripped from the substrate.

Figure 6:
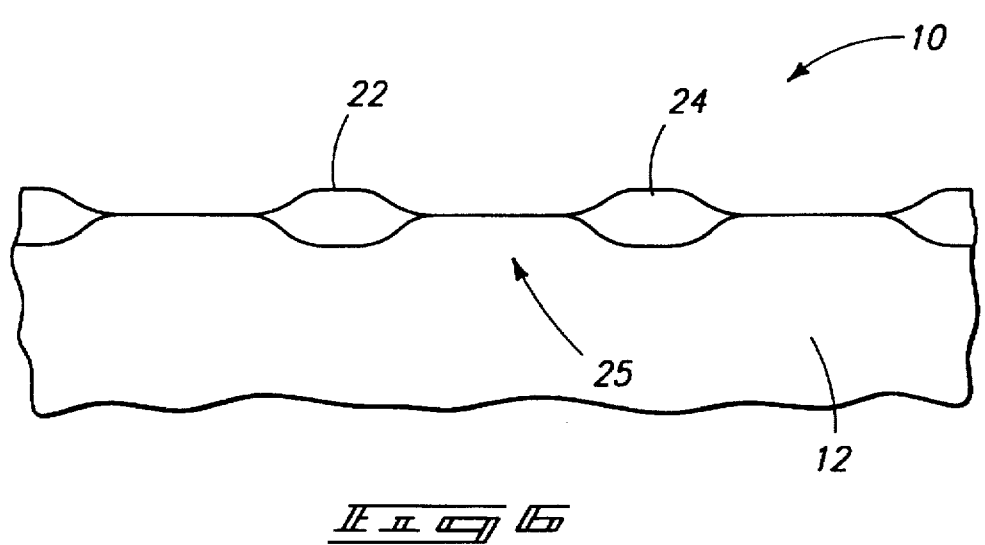
FIG. 6 is a view of the FIG. 1 wafer fragment at a processing step subsequent to that shown by FIG. 5.

Referring to FIG. 6, sacrificial pad oxide layer 14 is stripped from the substrate, with such stripping typically and preferably comprising etching from 50 Angstroms to 500 Angstroms of oxide from atop field oxide regions 22 and 24. Such pad oxide removal and etching of the field oxide regions also results in desired pull-back of the bird's beaks encroachment into the active area regions.

Figure 7:
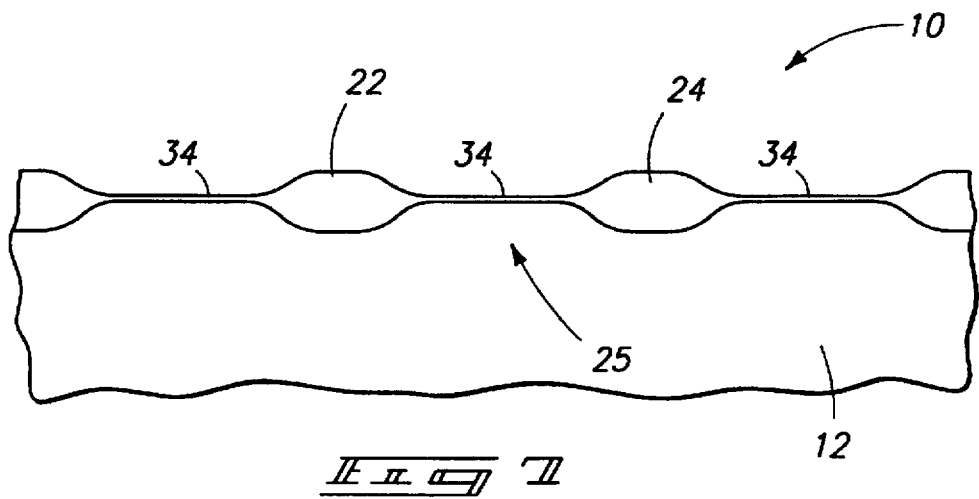
FIG. 7 is a view of the FIG. 1 wafer fragment at a processing step subsequent to that shown by FIG. 6.

Referring to FIG. 7, a sacrificial layer of oxide 34 is grown to a thickness of from 150 Angstroms to 350 Angstroms over the exposed silicon substrate, if desired, to overcome nitride problems associated with the Kooi effect. A considerably thinner layer of such sacrificial oxide grows in the field oxide regions 22 and 24 (i.e., 50–200 Angstroms).

Figure 8:
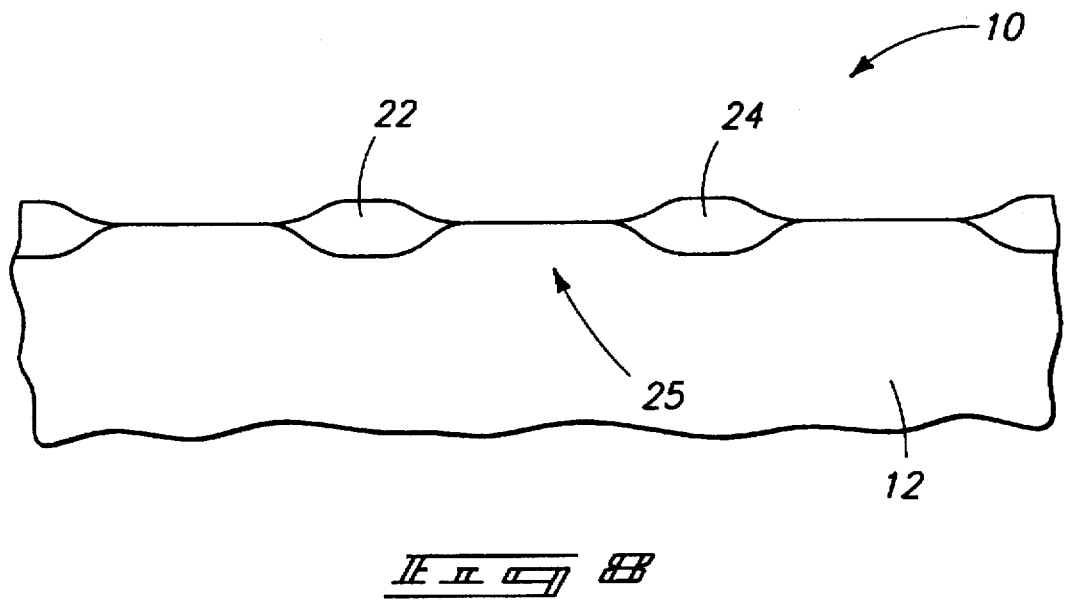
FIG. 8 is a view of the FIG. 1 wafer fragment at a processing step subsequent to that shown by FIG. 7.

Referring to FIG. 8, sacrificial oxide layer 34 is stripped from the substrate, typically resulting in oxide removal from field oxide regions 22 and 24 of from 200 Angstroms to 400 Angstroms. Such also provides an added effect of further reducing encroachment of the bird's beaks regions into the active areas.

Figure 9:
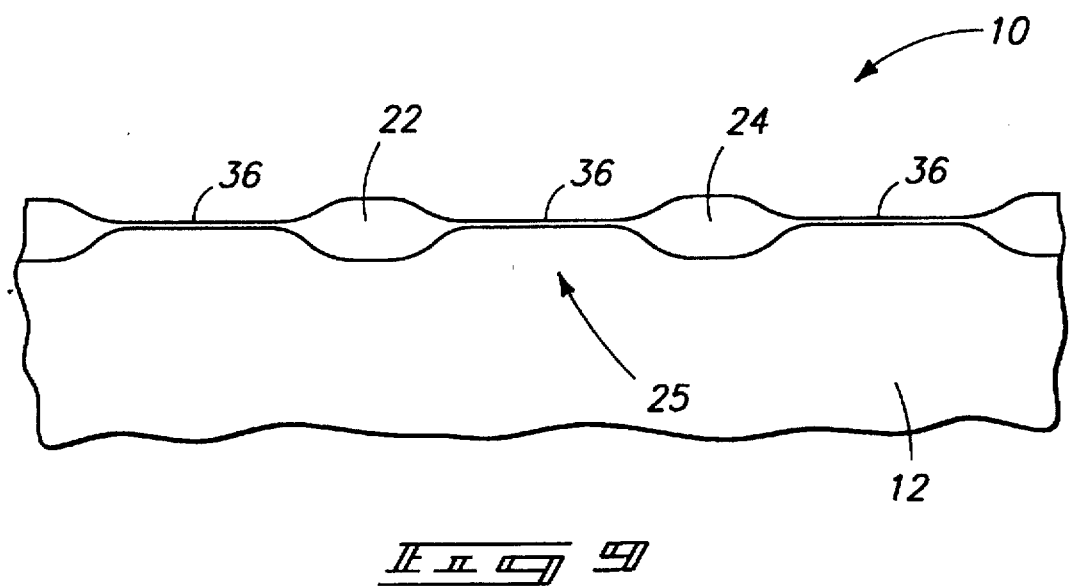
FIG. 9 is a view of the FIG. 1 wafer fragment at a processing step subsequent to that shown by FIG. 8.

Referring to FIG. 9, a gate oxide layer 36 is provided on the substrate over active area 25 between field oxide regions 22 and 24. In accordance with a significant feature of an aspect of the invention, the etching of the field oxide regions after their formation and immediately prior to provision of gate oxide layer 36 is conducted such that a total of from 250 Angstroms to 1000 Angstroms is removed from the field oxide regions. Such etching will result in a resultant width of the respective field oxide regions of from 0.20 micron to 0.40 micron in a key and resultant desired pitch of the adjacent pair of field oxide regions of from 0.5 micron to 0.7 micron.

The nitride thickness in comparison with the pad oxide thickness ranges from 1000 Angstroms to 3000 Angstroms for a pad oxide thickness of greater than 60 Angstroms up to 100 Angstroms. When the pad oxide thickness is 60 Angstroms or less, the masking nitride layer is provided to a thickness of from 500 Angstroms to 1000 Angstroms. An example preferred combination is a pad oxide layer thickness of 60 Angstroms and a nitride masking layer thickness of 1900 Angstroms. Preferred combinations of other parameters appear in the claims.

The above described process for provision of field oxide regions using the described LOCOS technology in 0.5 micron–0.7 micron pitch fabrication only applies within the above described combinations of specific parameters of oxide thicknesses, nitride thickness and resultant field oxide widths. For example, pad oxide thickness below 20 Angstroms will not provide effective protection of the silicon substrate during nitride removal. A pad oxide thickness of greater than 100 Angstroms will adversely and significantly increase the bird's beaks encroachment to an unacceptable level. Further, thicker nitride layers outside of the above described specific ranges have been determined to adversely impact stress in the resultant substrate after field oxidation to an unacceptable level. Thinner nitride layers outside of the above ranges leads to excessive and unacceptable encroachment, thus defeating the oxidation masking. Further, the above defined thickness range of from 1500 Angstroms to 3000 Angstroms of the field oxide regions immediately after field oxidation has been determined to be critical in the context of the 0.5 micron to 0.7 micron pitch density. Thinner oxide results in very low field oxide thickness in the array such that adequate isolation does not occur. Thicker field oxide formation again results in undesired excessive encroachment into the active area. Total oxide loss of field oxide outside of the stated and claimed 250 to 1000 Angstrom range between field oxidation and immediately prior to provision of gate oxide likewise results in unacceptable resultant isolation. The resultant field oxide width of from 0.20 micron to 0.40 micron is necessary in the context of the above described 0.5 micron to 0.7 micron pitch density.

The invention also comprises products produced by the above processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a pair of adjacent field oxide regions having a minimum pitch of from 0.5 micron to 0.7 micron on a semiconductor substrate, the method comprising the following steps:

forming a sacrificial pad oxide layer over a semiconductor substrate to a thickness of from 20 Angstroms to 100 Angstroms;

forming a patterned masking layer over the sacrificial pad oxide layer and over a desired active area region of the substrate, the masking layer comprising a nitride and having a thickness of from 500 Angstroms to 3000 Angstroms, the patterned masking layer comprising a pair of adjacent masking blocks having a minimum pitch of from 0.5 micron to 0.7 micron;

oxidizing portions of the substrate unmasked by the masking layer in an $H_2O$ steam comprising ambient at a pressure of from about 0.5 atmosphere to about 2 atmospheres and at a temperature of from about 900° C. to about 1200° C. to form at least one pair of adjacent field oxide regions on the subsrate, the formed field oxide regions having a location of maximum thickness of from 1500 Angstroms to 3000 Angstroms, the pair of field oxide regions defining an active area therebetween;

removing the patterned masking layer from the substrate;

removing the sacrificial pad oxide layer from over the active area between the pair of field oxide regions;

forming a gate oxide layer on the substrate over the active area between the pair of field oxide regions; and etching portions of the pair of field oxide regions prior to forming the gate oxide layer, such etching resulting in removal of a total of from 250 Angstroms to 1000 Angstroms of oxide from the field oxide regions prior to provision of the gate oxide layer, such etching resulting in a maximum width of the respective field oxide regions of from 0.20 micron to 0.40 micron and a minimum pitch of the adjacent pair of field oxide regions of from 0.5 micron to 0.7 micron.

2. The semiconductor processing method of claim 1 wherein the step of removing the sacrificial pad oxide layer also comprises etching from 50 Angstroms to 500 Angstroms of the field oxide regions.

3. The semiconductor processing method of claim 1 wherein the sacrificial pad oxide layer is formed to a thickness of less than or equal to 60 Angstroms, and the masking layer is provided to a thickness of from 500 Angstroms to 1000 Angstroms.

4. The semiconductor processing method of claim 1 wherein the sacrificial pad oxide layer is provided to a thickness of greater than 60 Angstroms, and the masking layer is provided to a thickness of from 1000 Angstroms to 3000 Angstroms.

5. The semiconductor processing method of claim 1 wherein the sacrificial pad oxide layer is provided to a thickness of 60 Angstroms, and the masking layer is provided to a thickness of 1900 Angstroms.

6. The semiconductor processing method of claim 1 wherein the step of removing the sacrificial pad oxide layer also comprises etching from 50 Angstroms to 500 Angstroms of the field oxide regions; and wherein the sacrificial pad oxide layer is provided to a thickness of less than or equal to 60 Angstroms, and the masking layer is provided to a thickness of from 500 Angstroms to 1000 Angstroms.

7. The semiconductor-processing method of claim 1 wherein the step of removing the sacrificial pad oxide layer also comprises etching from 50 Angstroms to 500 Angstroms of the field oxide regions; and wherein the sacrificial pad oxide layer is provided to a thickness of greater than 60 Angstroms, and the masking layer is provided to a thickness of from 1000 Angstroms to 3000 Angstroms.

8. The semiconductor processing method of claim 1 wherein the step of removing the sacrificial pad oxide layer also comprises etching from 50 Angstroms to 500 Angstroms of the field oxide regions; and wherein the sacrificial pad oxide layer is provided to a thickness of about 60 Angstroms, and the masking layer is provided to a thickness of about 1900 Angstroms.

9. The semiconductor processing method of claim 1 wherein the pressure during the oxidizing step is about 1 atmosphere.

10. The semiconductor processing method of claim 1 wherein the temperature during the oxidizing step is from about 1050° C. to about 1100° C.

11. The semiconductor processing method of claim 1 wherein the pressure during the oxidizing step is about 1 atmosphere, and the temperature during the oxidizing step is from about 1050° C. to about 1100° C.

12. A semiconductor processing method of forming a pair of adjacent field oxide regions having a minimum pitch of from 0.5 micron to 0.7 micron on a semiconductor substrate, the method comprising the following steps:

forming a sacrificial pad oxide layer over a semiconductor substrate to a thickness of from 50 Angstroms to 70 Angstroms;

forming a patterned masking layer over the sacrificial pad oxide layer and over a desired active area region of the substrate, the masking layer comprising a nitride and having a thickness of from 1700 Angstroms to 2100 Angstroms, the patterned masking layer comprising a pair of adjacent masking blocks having a minimum pitch of from 0.5 micron to 0.7 micron;

oxidizing portions of the substrate unmasked by the masking layer in an $H_2O$ steam comprising ambient at a pressure of from about 0.8 atmosphere to about 1.2 atmospheres and at a temperature of from about 1000° C. to about 1150° C. to from at least one pair of adjacent field oxide regions on the substrate, the formed field oxide regions having a location of maximum thickness of from 2000 Angstroms to 2400 Angstroms, the pair of field oxide regions defining an active area therebetween;

removing the patterned masking layer from the substrate;

removing the sacrificial pad oxide layer from over the active area between the pair of fiend oxide regions;

forming a gate oxide layer on the substrate over the active area between the pair of field oxide regions; and etching portions of the pair of field oxide regions prior to providing the gate oxide layer, such etching resulting in removal of a total of from 250 Angstroms to 1000 Angstroms of oxide from the field oxide regions prior to provision of the gate oxide layer, such etching resulting in a maximum width of the respective field oxide regions of from 0.20 micron to 0.40 micron and a minimum pitch of the adjacent pair of field oxide regions of from 0.5 micron to 0.7 micron.

13. The semiconductor processing method of claim 12 wherein the step of removing the pad oxide also comprises etching from 50 Angstroms to 500 Angstroms of the field oxide regions.

14. The semiconductor processing method of claim 12 wherein the sacrificial pad oxide layer is provided to a thickness of about 60 Angstroms.

15. The semiconductor processing method of claim 12 wherein the masking layer is provided to a thickness of about 1900 Angstroms.

16. The semiconductor processing method of claim 12 wherein the formed field oxide regions have a location of maximum thickness of about 2200 Angstroms.

17. The semiconductor processing method of claim 12 wherein the sacrificial pad oxide layer is provided to a thickness of 60 Angstroms, and the masking layer is provided to a thickness of 1900 Angstroms.

18. The semiconductor processing method of claim 12 wherein the sacrificial pad oxide layer is provided to a thickness of about 60 Angstroms, and the formed field oxide regions have a location of maximum thickness of about 2200 Angstroms.

19. The semiconductor processing method of claim 12 wherein the masking layer is provided to a thickness of about 1900 Angstroms, and the formed field oxide regions have a location of maximum thickness of about 2200 Angstroms.

20. The semiconductor processing method of claim 12 wherein the sacrificial pad oxide layer is provided to a thickness of 60 Angstroms, the masking layer is provided to a thickness of 1900 Angstroms, and the formed field oxide regions have a location of maximum thickness of about 2200 Angstroms.

* * * * *

UNITED STATES PATENT AND TRADEMARK OFFICE
CERTIFICATE OF CORRECTION

PATENT NO. : 5,674,776
DATED : October 7, 1997
INVENTOR(S) : Viju Mathews et al.

It is certified that error appears in the above-identified patent and that said Letters Patent is hereby corrected as shown below:

In column 7, line 33, delete the word "from" and insert the word --form--.

In column 7, line 41, delete the word "fiend" and insert the word --field--.

Signed and Sealed this

Twelfth Day of May, 1998

Attest:

BRUCE LEHMAN

*Attesting Officer*   Commissioner of Patents and Trademarks